(12) United States Patent
Paschal (10) Patent No.: US 12,278,640 B1
(45) Date of Patent: Apr. 15, 2025

(54) PHASE ALIGNMENT OF SIGNALS OF DIFFERENT FREQUENCIES

(71) Applicant: International Business Machines Corporation, Armonk, NY (US)

(72) Inventor: Matthew James Paschal, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/490,245

(22) Filed: Oct. 19, 2023

(51) Int. Cl.
*H03L 7/081* (2006.01)
*H03L 7/085* (2006.01)
*H03L 7/183* (2006.01)

(52) U.S. Cl.
CPC ............ *H03L 7/0818* (2013.01); *H03L 7/085* (2013.01); *H03L 7/183* (2013.01)

(58) Field of Classification Search
CPC ........ H03L 7/0818; H03L 7/085; H03L 7/183
See application file for complete search history.

(56) References Cited

U.S. PATENT DOCUMENTS

| 6,812,760 | B1 * | 11/2004 | Kim | ............ H03L 7/0818 327/158 |
|---|---|---|---|---|
| 6,898,742 | B2 | 5/2005 | Koyanagi | |
| 7,199,624 | B2 | 4/2007 | Wong | |
| 9,164,534 | B2 * | 10/2015 | Nemoto | ............ H03K 5/00 |
| 10,505,550 | B1 | 12/2019 | Quan | |
| 10,623,174 | B1 | 4/2020 | Remla | |
| 11,264,078 | B2 | 3/2022 | Penney | |
| 11,428,732 | B2 * | 8/2022 | Brush | ............ G01R 13/0254 |
| 11,545,983 | B2 * | 1/2023 | Tsai | ............ H03L 7/093 |
| 11,764,913 | B2 * | 9/2023 | Ranganathan | ..... G01R 31/3016 375/226 |
| 12,101,088 | B2 * | 9/2024 | Xu | ............ G06F 13/36 |
| 2002/0071510 | A1 | 6/2002 | Drerup | |
| 2003/0074609 | A1 | 4/2003 | Koyanagi et al. | |
| 2004/0217787 | A1 | 11/2004 | Wong et al. | |
| 2004/0217788 | A1 * | 11/2004 | Kim | ............ H03L 7/089 327/158 |

(Continued)

FOREIGN PATENT DOCUMENTS

CN 114531151 A * 5/2022 ........... H03D 13/004

OTHER PUBLICATIONS

Ji, Runhan & Tian, Bin & Cui, Wenhui & Shi, Jiang & Sun, Zhenyu & Yang, Zhaoqiang. (2013). MCDC: A Novel Mixed Clock Deskewing Circuit. International Journal of Machine Learning and Computing. 3. 508-511. 10.7763/IJMLC.2013. V3.370.

Lin, Y., Wenjing Kang, Xiaofei Chen, Jing Zhang and Xuecheng Zou, "A novel 1.2 GBPS LVDS receiver for multi- channel applications," Proceedings of the 2009 12th International Symposium on Integrated Circuits, Singapore, 2009, pp. 287-290.

(Continued)

*Primary Examiner* — Adam D Houston
(74) *Attorney, Agent, or Firm* — CANTOR COLBURN LLP; Yuanmin Cai (57) ABSTRACT

A deskew circuit receives a data signal and a clock signal of differing frequencies and indeterminate phase relationship. The deskew circuit selectively applies a delay to a data signal to obtain a delayed data signal. First and second latches of the deskew circuit latch the delayed data signal based on a rising edge and a falling edge of the clock signal, respectively. The deskew circuit detects a phase difference between output signals of the first and second latches. The deskew circuit adjusts the delay applied to the data signal based on the detected phase difference.

19 Claims, 4 Drawing Sheets

(56) References Cited

U.S. PATENT DOCUMENTS

| | | | |
|---|---|---|---|
| 2004/0239388 A1* | 12/2004 | Lee | H03K 5/131 327/158 |
| 2008/0122544 A1* | 5/2008 | Wang | H03L 7/0893 331/17 |
| 2008/0165591 A1* | 7/2008 | Kim | G11C 7/22 365/194 |
| 2008/0258785 A1* | 10/2008 | Ma | H03L 7/0814 327/141 |
| 2009/0146707 A1* | 6/2009 | Shin | H03L 7/0814 327/158 |
| 2020/0212915 A1 | 7/2020 | Attineni | |
| 2021/0063475 A1* | 3/2021 | Brush | G01R 13/0254 |
| 2021/0241813 A1 | 8/2021 | Penney et al. | |
| 2022/0173742 A1 | 6/2022 | Nelson | |
| 2022/0239298 A1 | 7/2022 | Tsai et al. | |

OTHER PUBLICATIONS

Torralba, G. et al., "A Vlsi for deskewing and fault tolerance in LVDS links," 14th IEEE-NPSS Real Time Conference, 2005., Stockholm, Sweden, 2005, pp. 6 pp.-, doi: 10.1109/RTC.2005.1547515.

Zhang, L., B. Ciftcioglu and Hui Wu, "Active deskew in injection-locked clocking," 2008 IEEE Custom Integrated Circuits Conference, San Jose, CA, 2008, pp. 567-570, doi: 10.1109/CICC.2008.4672148.

Zheng, Y. and J. Liu, "A 5 GB/s Automatic Within-Pair Skew Compensator for Differential Data in 0.13 μm CMOS," in IEEE Transactions on Circuits and Systems I: Regular Papers, vol. 58, No. 6, pp. 1191-1202, Jun. 2011, doi: 10.1109/TCSI.2010.2094317.

* cited by examiner

PHASE ALIGNMENT OF SIGNALS OF DIFFERENT FREQUENCIES

BACKGROUND OF THE INVENTION

The present invention relates in general to electronic systems, and in particular, a deskew circuit for aligning the phases of signals of different frequencies.

Electronic systems, such as integrated circuits, often include signals of differing frequencies and indeterminate phase relationship. As one example, an integrated circuit, such as a processor chip, may have a high frequency clock signal (e.g., in the GHz range) and have a low frequency data signal (e.g., in the MHz range) of indeterminate phase relationship with the clock signal.

In some prior art systems, software or complicated delay-lock loop hardware has been utilized to capture the data in such data signals. The present application appreciates that it would be useful and desirable to provide an improved circuit to align the phases of signals of differing frequencies, thus allowing, for example, data from a data signal having a different frequency and indeterminate phase relationship with a clock signal to be captured by a latch driven by the clock signal while avoiding latch metastability.

SUMMARY OF THE INVENTION

In at least one embodiment, a deskew circuit receives a data signal and a clock signal of differing frequencies and indeterminate phase relationship. The deskew circuit selectively applies a delay to a data signal to obtain a delayed data signal. First and second latches of the deskew circuit latch the delayed data signal based on a rising edge and a falling edge of the clock signal, respectively. The deskew circuit detects a phase difference between output signals of the first and second latches. The deskew circuit adjusts the delay applied to the data signal based on the detected phase difference.

In accordance with common practice, various features illustrated in the drawings may not be drawn to scale. Accordingly, dimensions of the various features may be arbitrarily expanded or reduced for clarity. In addition, some of the drawings may not depict all of the components of a given system, method, or device. Finally, like reference numerals may be used to denote like or corresponding features in the specification and figures.

DETAILED DESCRIPTION OF ILLUSTRATIVE EMBODIMENT

When the phase relationship between two signals is unknown a deskew circuit is commonly employed to align the rising and/or falling edges of these signals. For example, a deskew circuit can be utilized to phase-align the clock and data inputs of a flip-flop or latch to avoid output metastability. In a latch triggered on the rising edge of the clock input, the rising edge of the clock signal cannot be coincident with the rising or falling edges of the data signal; otherwise, the output can be metastable, causing slow output edges and/or high jitter.

The present application discloses an improved deskew circuit for aligning the phases of two signals of differing frequencies. The deskew circuit includes two latches that sample a lower frequency data signal on the rising and falling edges of a higher frequency clock signal. The outputs of these two latches form the inputs of a delay control circuit. The delay control circuit includes a phase detector that detects a phase difference between the latch outputs. Based on the detected phase difference, the delay control circuit controls a variable delay line to apply a selected amount of delay to the data signal to appropriately shift the delayed data signal into phase alignment with the clock signal. This deskew circuit can, for example, align the rising edge of the delayed data signal with the rising or falling edge of the clock signal.

Figure 1:
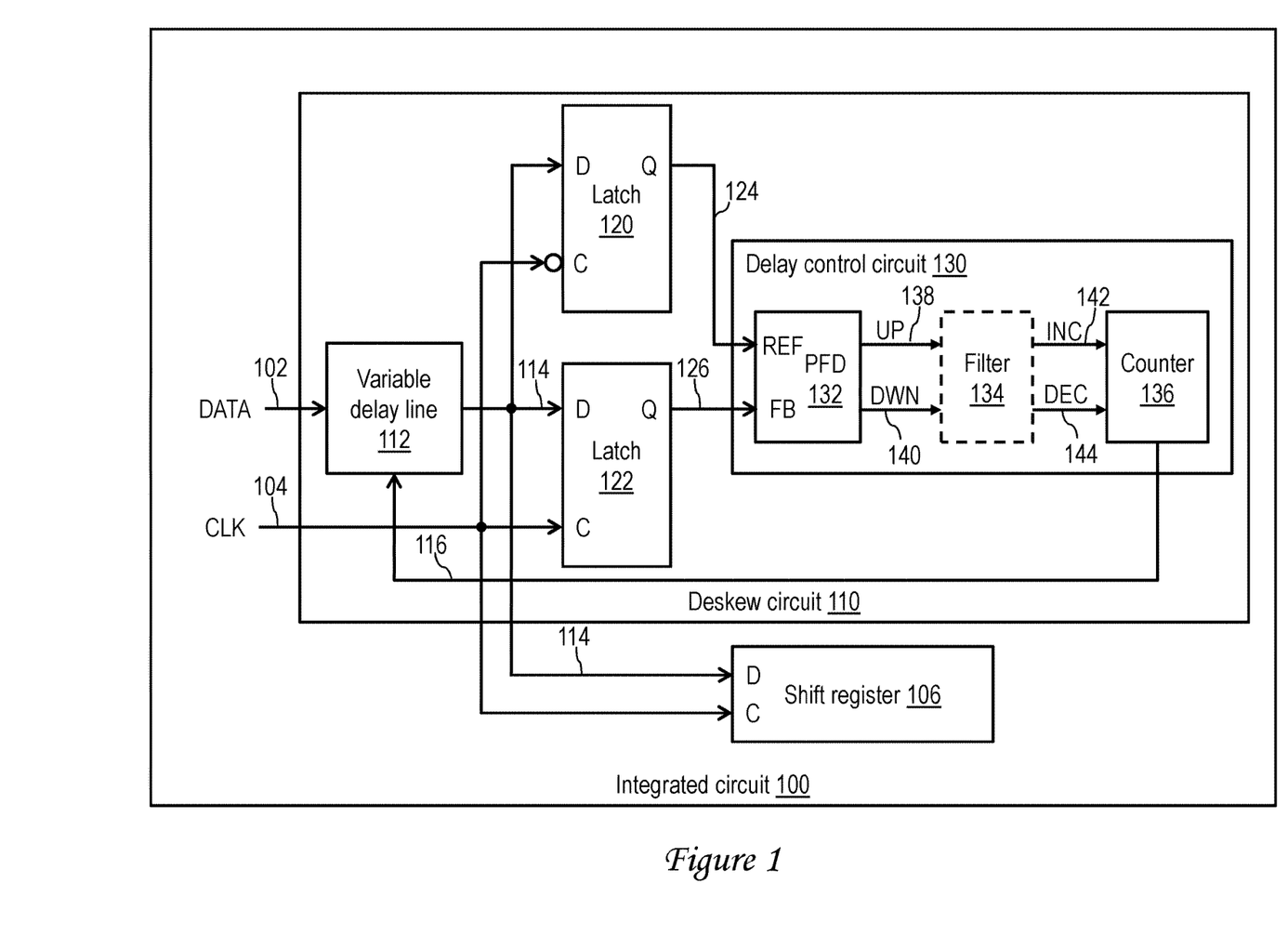
FIG. 1 is a high-level block diagram of an exemplary electronic system in accordance with one or more embodiments.

With reference now to the figures, and in particular, with reference to FIG. 1, there is illustrated a high-level block diagram of an exemplary electronic system in accordance with one or more embodiments. In the depicted example, the electronic system comprises an integrated circuit 100, which, as known in the art, includes a semiconductor substrate on which integrated circuitry is fabricated. Integrated circuit 100 may be, for example, a processor chip, an input/output (I/O) chip, an embedded controller chip, or other type of integrated circuit.

In the illustrated example, integrated circuit 100 includes a data signal 102 and a clock signal 104 having differing frequencies and an indeterminate or variable phase relationship. In the following discussion, it is hereafter assumed that data signal 102 has a lower frequency, for example, in the MHz range, and clock signal 104 has a higher frequency, for example, in the GHz range. In one particular embodiment, clock signal 104 may have the base frequency of the clock distribution network of integrated circuit 100. In some embodiments, integrated circuit 100 derives the frequency of data signal 102 from the frequency of clock signal 104, for example, by an unillustrated clock divider.

In the illustrated integrated circuit 100, data within data signal 102 are to be captured by a clocked latching circuit, such as shift register 106, which can be formed, for example, by a string of D flip-flops. Shift register 106 has a data (D) input coupled to receive the data in data signal 102 and a clock (C) input coupled to receive clock signal 104. As is known to those skilled in the art, if the timing of the transitions present in data signal 102 does not satisfy the setup-and-hold requirements of a clocked latching circuit with respect to transitions in clock signal 104, the clocked latching circuit can become metastable and be unable to correctly sample the data. Accordingly, it is desirable to align the phase of the data signal sampled by the clocked latching circuit (e.g., shift register 106) with that of clock signal 104.

In order to align the phase of the data signal sampled by the clocked latching circuit (e.g., shift register 106) with that of clock signal 104, integrated circuit 100 includes a deskew circuit 110 as shown in FIG. 1. In the illustrated example, deskew circuit 110 includes a variable delay line 112, which imposes a selectable and variable delay (e.g., ranging from no delay up to a full cycle of clock signal 104) on data signal 102 to obtain a delayed data signal 114. The amount of delay imposed by variable delay line 112, which can be quantized, for example, in steps of multiple picoseconds, is controlled by a delay control signal 116.

Deskew circuit 110 additionally includes a first latch 120 that latches delayed data signal 114 on the falling edge of clock signal 104 and a second latch 122 that latches delayed data signal 114 on the rising edge of clock signal 104. In the illustrated example, latches 120 and 122 are illustrated as D flip-flops; in other embodiments, other types of latch circuits can be employed as is known in the art. First latch 120 outputs a first latch output signal 124, and second latch 122 outputs a second latch output signal 126.

Deskew circuit 110 further includes a delay control circuit 130. Delay control circuit 130 includes a phase frequency detector (PFD) 132 having a reference clock input (REF) and a feedback input (FB) that respectively receive as inputs the first and second latch output signals 124 and 126 produced by first and second latches 120 and 122. PFD 132 detects the phase difference between first latch output signal 124 and second latch output signal 126 and generates an UP pulse 138 and DWN pulse 140 having pulse widths indicative of whether or not first latch output signal 124 leads or lags second latch output signal 126. Delay control circuit 130 can optionally include a filter 134 (also referred to as a loop filter) that receives UP pulse 138 and DWN pulse 140 and digitally filters out spurious changes in UP pulse 138 and DWN pulse 140 due to transient jitter in data signal 102 and/or clock signal 104. Filter 134 produces an INC signal 142 and DEC signal 144 that respectively indicate whether a count value maintained by counter 136, which controls the amount of delay imposed by variable delay line 112 via delay control signal 116, should be increased or decreased. In the particular example shown, delay control circuit 130 adjusts the delay applied by variable delay line 112 to apply a selected amount of delay to data signal 102 to shift the rising edge of delayed data signal 114 into phase alignment with the falling edge of clock signal 104. In an alternative embodiment, the rising edge of delayed data signal 114 can be phase-aligned with the rising edge of clock signal 104 by connecting first output latch signal 124 to the FB input of PFD 132 and second output latch signal 126 to the REF input of PFD 132.

Figure 2A:
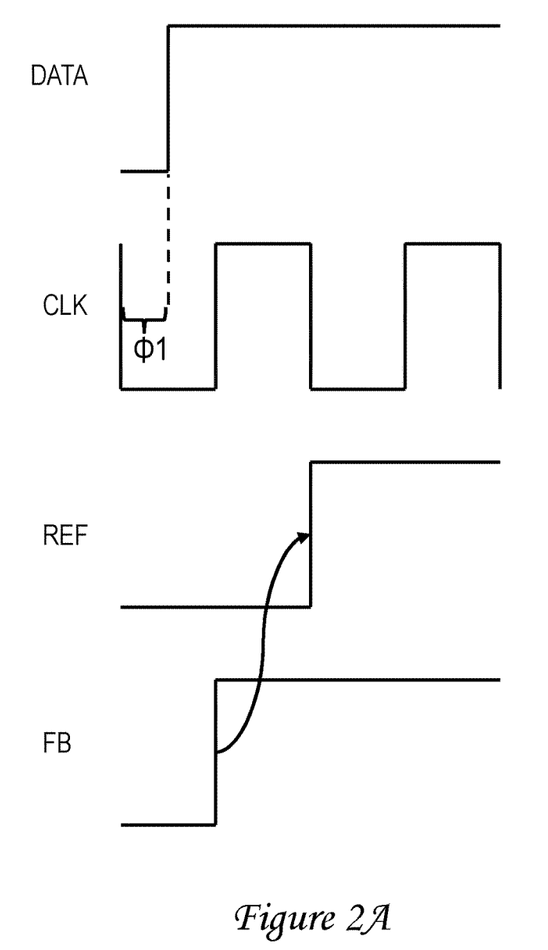
FIGS. 2A and 2B are timing diagrams illustrating phase alignment of data signals that are leading and a lagging a clock signal, respectively.
Figure 2B:
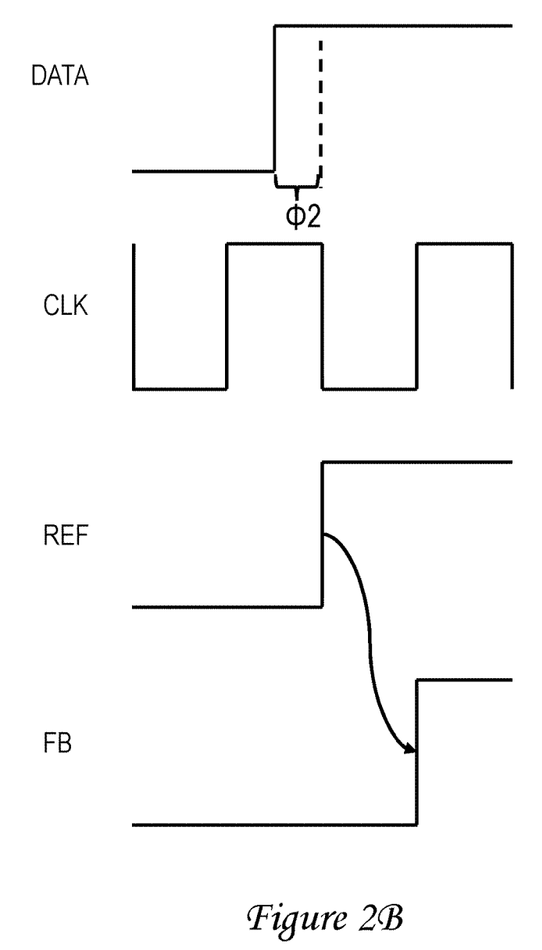

Referring now to FIGS. 2A and 2B, timing diagrams illustrating phase alignment of data signals that are leading and lagging a falling edge of a clock signal, respectively, are presented. In FIG. 2A, data signal 102 leads the falling edge of clock signal 104 by phase difference $\Phi 1$. As a result, first latch output signal 124 received at the REF input of PFD 132 leads second latch signal 126 received at FB input of PFD 132 by half of the period of clock signal 104. In response to sensing the phase difference between the signals presented to its inputs, PFD 132 of delay control circuit 130 causes counter 136 to be incremented, thus controlling variable delay line 112 to increase the delay applied to data signal 102 and align its phase with the falling edge of clock signal 104.

In FIG. 2B, data signal 102 lags the falling edge of clock signal 104 by phase difference $\Phi 2$. As a result, first latch output signal 124 received at the REF input of PFD 132 lags second latch signal 126 received at FB input of PFD 132 by half of the period of clock signal 104. In response to sensing the phase difference between the signal presented at its inputs, PFD 132 of delay control circuit 130 causes counter 136 to be decremented, thus controlling variable delay line 112 to decrease the delay applied to data signal 102 and thus align its phase with the falling edge of clock signal 104.

Figure 3:
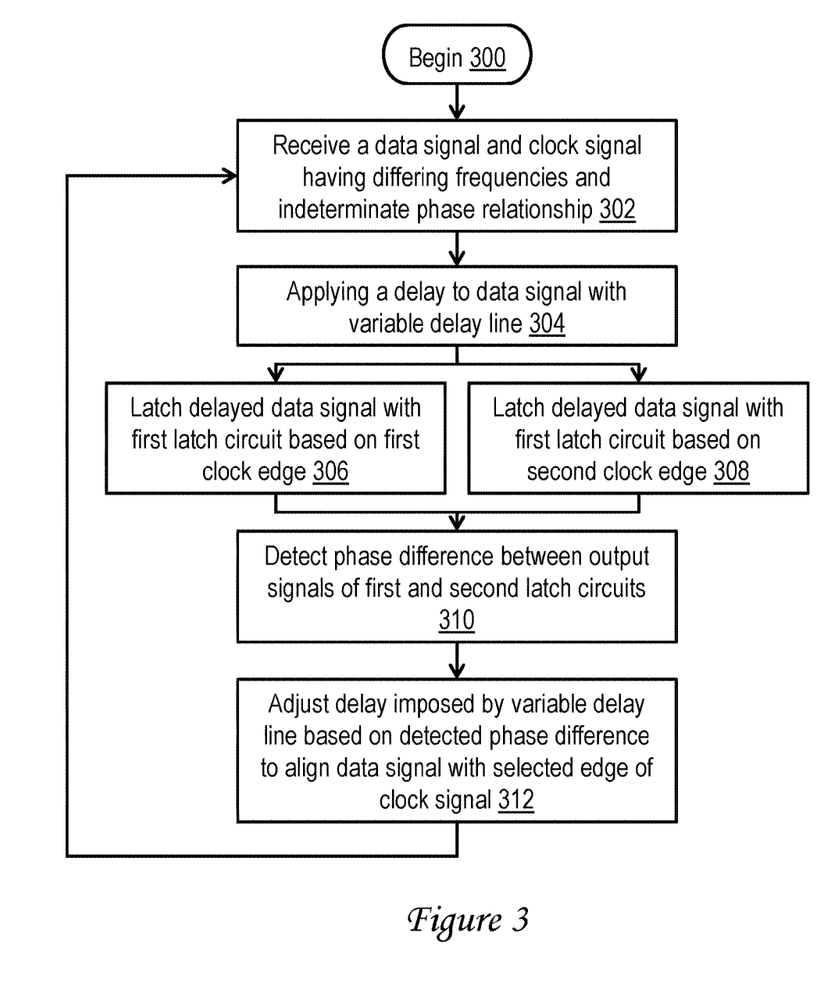
FIG. 3 is a high-level logical flowchart of an exemplary deskewing method in accordance with one or more embodiments.

With reference now to FIG. 3, there is illustrated a high-level logical flowchart of an exemplary deskewing method in accordance with one or more embodiments. The illustrated method can be performed, for example, by deskew circuit 110 of FIG. 1.

The method of FIG. 3 begins at block 300 and then proceeds to block 302, which illustrates deskew circuit 110 receiving a lower frequency data signal and a higher frequency clock signal having an indeterminate phase relationship. A variable delay line 112 of deskew circuit 110 delays the data signal by a selected duration to obtain a delayed data signal 114 (block 304). Delayed data signal 114 is then latched by a first latch 120 on a first clock edge (block 306) and latched by a second latch 122 on a different second clock edge (block 308). A delay control circuit 130 within deskew circuit 110 then detects a phase difference between the output signals of the first and second latches 120 and 122 (block 310). Based on the phase difference detected at block 310, delay control circuit 130 adjusts the delay imposed by variable delay line 112 on data signal 102 to align the rising edge of delayed data signal 114 with a selected edge of clock signal 104 (block 312). Thereafter, the process of FIG. 3 returns to block 302 and continues iteratively.

Figure 4:
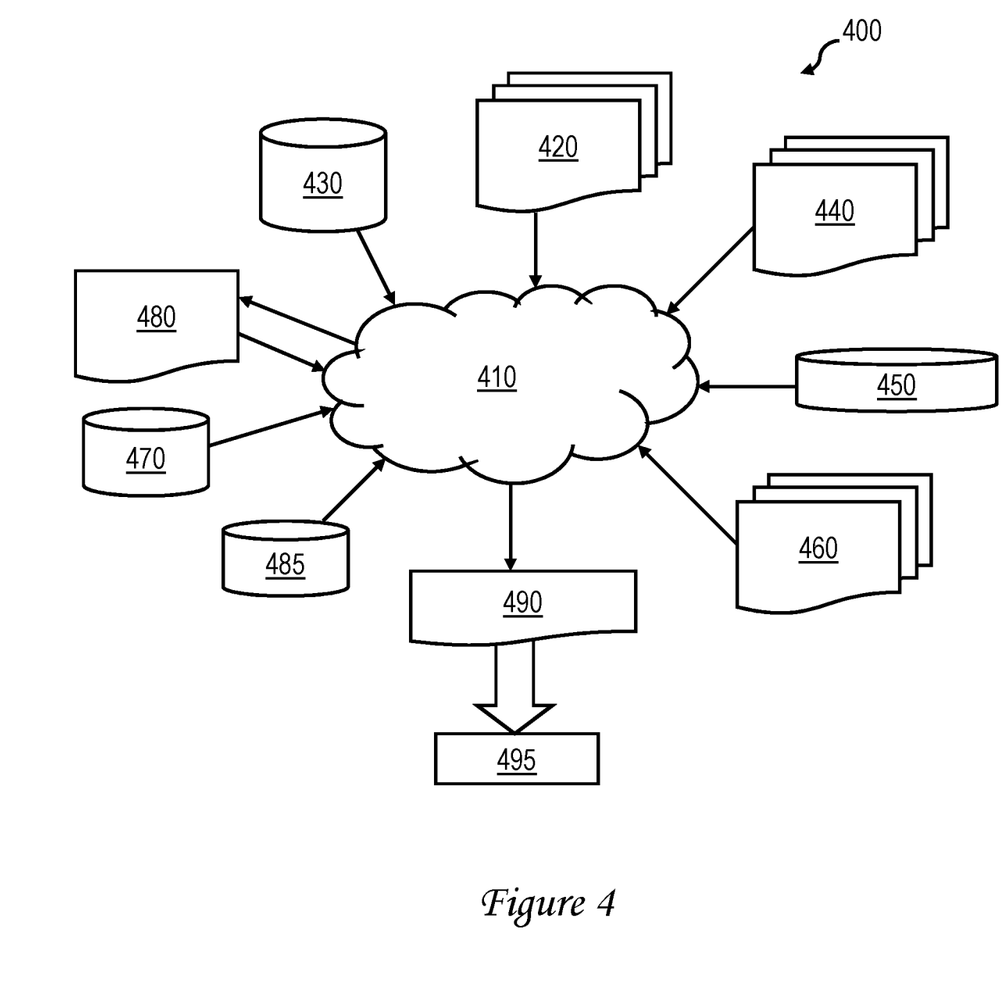
FIG. 4 illustrates an exemplary design process in accordance with one or more embodiments.

Referring now to FIG. 4, there is depicted a block diagram of an exemplary design flow 400 used for example, in semiconductor IC logic design, simulation, test, layout, and manufacture. As one example, design flow 400 can be utilized to design, simulate, test, layout, and manufacture integrated circuit 100 of FIG. 1. Design flow 400 includes processes, machines and/or mechanisms for processing design structures or devices to generate logically or otherwise functionally equivalent representations of the design structures and/or devices described above. The design structures processed and/or generated by design flow 400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, or system such as those shown herein. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or logic structures shown herein to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 7 nm, 10 nm, 20 nm, 30 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410 without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures along with any additional mechanical design or data (if applicable), to generate a second design structure 490. Design structure 490 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 490 may comprise a compiled, executable HDL simulation model that functionally simulates one or more of the devices shown herein.

Design structure 490 may also employ a data format used for the exchange of layout data of integrated circuits and/or symbolic data format (e.g., information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 490 may then proceed to a stage 495 where, for example, design structure 490: proceeds to tape-out, is released to manufacturing, is released to a mask house, is sent to another design house, is sent back to the customer, etc.

As has been described, in at least one embodiment, a deskew circuit receives a data signal and a clock signal of differing frequencies and indeterminate phase relationship. The deskew circuit selectively applies a delay to a data signal to obtain a delayed data signal. First and second latches of the deskew circuit latch the delayed data signal based on a rising edge and a falling edge of the clock signal, respectively. The deskew circuit detects a phase difference between output signals of the first and second latches. The deskew circuit adjusts the delay applied to the data signal based on the detected phase difference.

The present invention may be implemented as a method, a system, and/or a computer program product. The computer program product may include a storage device having computer-readable program instructions (program code) thereon for causing a processor to carry out aspects of the present invention. As employed herein, a "storage device" is specifically defined to include only statutory articles of manufacture and to exclude signal media per se, transitory propagating signals per se, and energy per se.

Aspects of the present invention are described herein with reference to flowchart illustrations and/or block diagrams that illustrate the architecture, functionality, and operation of possible implementations of systems, methods, and computer program products according to various embodiments. It will be understood that each block of the block diagrams and/or flowcharts and combinations of blocks in the block diagrams and/or flowcharts can be implemented by special purpose hardware-based systems and/or program code that perform the specified functions. While the present invention has been particularly shown as described with reference to one or more preferred embodiments, it will be understood by those skilled in the art that various changes in form and detail may be made therein without departing from the spirit and scope of the invention.

The figures described above and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms and that multiple of the disclosed embodiments can be combined. Lastly, the use of a singular term, such as, but not limited to, "a" is not intended as limiting of the number of items.

What is claimed is:

1. A method of phase alignment in a circuit, the method comprising:
    receiving, by a deskew circuit, a data signal and a clock signal of differing frequencies and indeterminate phase relationship;
    selectively applying a delay, by the deskew circuit, to the data signal to obtain a delayed data signal;
    latching, by first and second latches of the deskew circuit, the delayed data signal based on a rising edge of the clock signal and based on the falling edge of the clock signal, respectively;
    detecting, by the deskew circuit, a phase difference between output signals of the first and second latches; and
    adjusting, by the deskew circuit, the delay applied to the data signal based on the detected phase difference.

2. The method of claim 1, wherein a frequency of the data signal is lower than a frequency of the clock signal.

3. The method of claim 1, wherein the latching by the first and second latches comprises latching the delayed data signal with first and second D flip-flops.

4. The method of claim 1, wherein the adjusting comprises aligning a rising edge of the delayed data signal with a falling edge of the clock signal.

5. The method of claim 1, wherein the adjusting comprises aligning a rising edge of the delayed data signal with a rising edge of the clock signal.

6. The method of claim 1, wherein the adjusting includes updating a counter within the deskew circuit.

7. An integrated circuit, comprising:
    a deskew circuit configured to:
        receive a data signal and a clock signal of differing frequencies and indeterminate phase relationship;
        selectively apply a delay to the data signal to obtain a delayed data signal;
        latch, utilizing first and second latches, the delayed data signal based on a rising edge of the clock signal and based on the falling edge of the clock signal, respectively;
        detect a phase difference between output signals of the first and second latches; and
        adjust the delay applied to the data signal based on the detected phase difference.

8. The integrated circuit of claim 7, wherein a frequency of the data signal is lower than a frequency of the clock signal.

9. The integrated circuit of claim 7, wherein the first and second latches comprise first and second D flip-flops.

10. The integrated circuit of claim 7, wherein the deskew circuit is configured to align a rising edge of the delayed data signal with a falling edge of the clock signal.

11. The integrated circuit of claim 7, wherein the deskew circuit is configured to align a rising edge of the delayed data signal with a rising edge of the clock signal.

12. The integrated circuit of claim 7, wherein the deskew circuit includes a counter having a count value that determines a duration of the delay.

13. An integrated circuit, comprising:
    a deskew circuit, including:
        a variable delay line configured to selectively apply a delay to a data signal to obtain a delayed data signal based on a delay control signal;
        a first latch and a second latch, wherein the first latch is configured to latch the delayed data signal based on a rising edge of the clock signal and the second latch is configured to latch the delayed data signal based on the falling edge of the clock signal;
        a delay control circuit coupled to receive output signals of the first and second latches, wherein the delay control circuit includes a phase frequency detector configured to detect a phase difference between output signals of the first and second latches, and wherein the delay control circuit is configured to update the delay control signal, based on the detected phase difference, to adjust the delay applied to the data signal by the variable delay line.

14. The integrated circuit of claim 13, wherein a frequency of the data signal is lower than a frequency of the clock signal.

15. The integrated circuit of claim 13, wherein the first and second latches comprise first and second D flip-flops.

16. The integrated circuit of claim 13, wherein the deskew circuit is configured to align a rising edge of the delayed data signal with a falling edge of the clock signal.

17. The integrated circuit of claim 13, wherein the deskew circuit is configured to align a rising edge of the delayed data signal with a rising edge of the clock signal.

18. The integrated circuit of claim 7, wherein:
    the deskew circuit includes a counter coupled to the phase frequency detector;
    a count value of the counter is updated by the deskew circuit based on the detected phase difference; and
    the count value determines the update to the delay control signal.

19. The integrated circuit of claim 7, further comprising a filter coupled between the phase frequency detector and the counter.

* * * * *